United States Patent [19]
Steiger et al.

[11] Patent Number: 6,072,695
[45] Date of Patent: Jun. 6, 2000

[54] HORIZONTAL LOADING DOCKING STATION WITH UNINTERRUPTED POWER SUPPLY

[75] Inventors: Gerald W. Steiger, Corvallis; Ralph W. Kinser, Albany; Jacques H. Helot, Corvallis; Daniel I. Croft, Monmouth, all of Oreg.; Richard Hollon, Jr., Half Moon Bay, Calif.

[73] Assignee: Hewlett-Packard Company, Palo Alto, Calif.

[21] Appl. No.: 08/960,736

[22] Filed: Oct. 30, 1997

[51] Int. Cl.$^7$ ........................................ G06F 1/16
[52] U.S. Cl. ..................... 361/686; 361/725; 361/726; 361/727
[58] Field of Search .................... 361/686, 724, 361/725, 726, 727

[56] References Cited

U.S. PATENT DOCUMENTS

| | | | |
|---|---|---|---|
| 5,619,398 | 4/1997 | Harrison et al. | 361/686 |
| 5,633,572 | 5/1997 | Steele et al. | 320/2 |
| 5,870,283 | 2/1999 | Maeda et al. | 361/686 |

*Primary Examiner*—Leo P. Picard
*Assistant Examiner*—John D. Reed

[57] ABSTRACT

A manually activated docking station that readily receives a generally horizontally inserted mobile computing device. Movement of a manual activation member causes engagement fingers to positively engage a mobile computing device and pull the port of the computing device onto the port of the docking station. Also disclosed are a unique locking method that impedes movement of the manual activation member and an uninterrupted power supply.

18 Claims, 5 Drawing Sheets

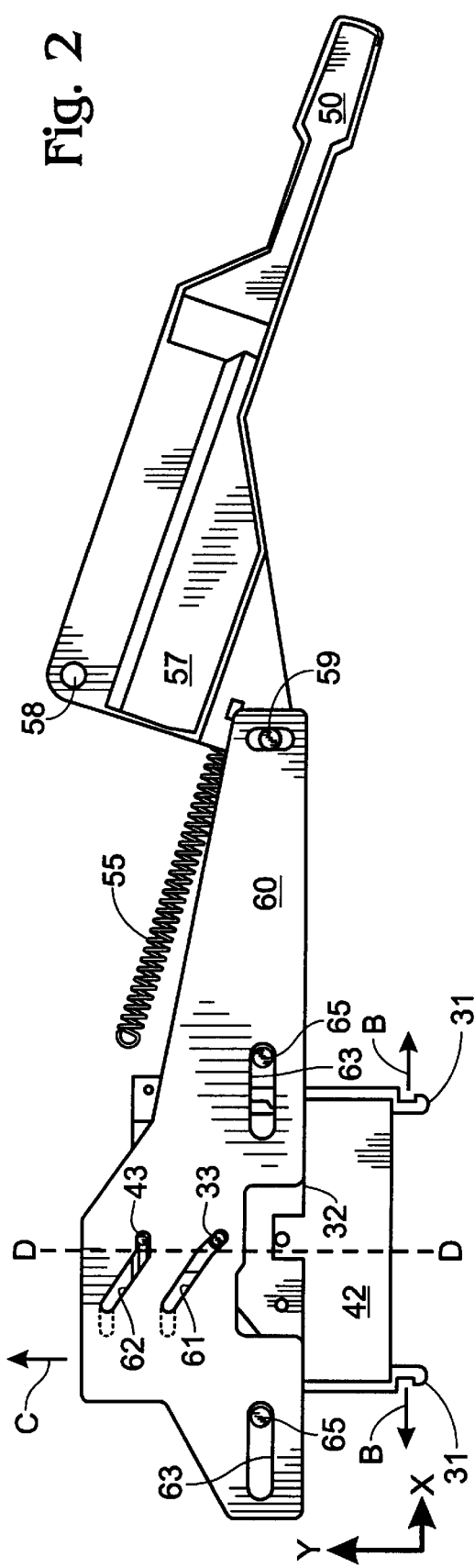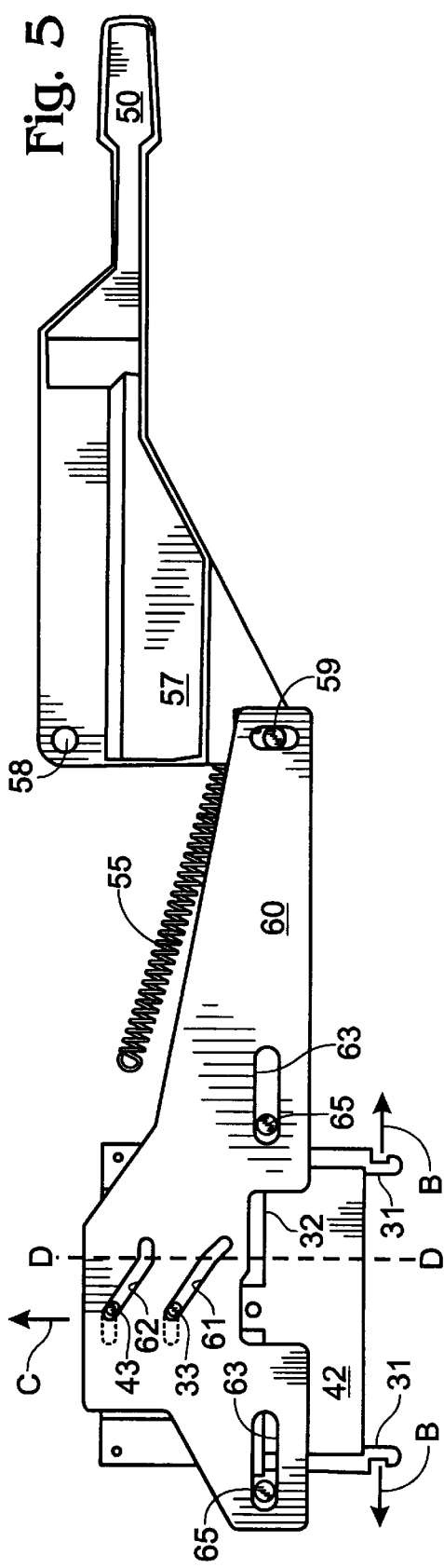

HORIZONTAL LOADING DOCKING STATION WITH UNINTERRUPTED POWER SUPPLY

FIELD OF THE INVENTION

The present invention relates to docking stations and port replicators for mobile computing devices.

BACKGROUND OF THE INVENTION

The prior art contains many types of docking stations for mobile computing devices. Many of these stations, however, are not well suited for use under a monitor.

For example, some docking stations require vertical alignment of a mobile computing device with the docking station prior to docking. This arrangement is disadvantageous because there is often insufficient space between the bottom of a monitor stand and a desktop to readily achieve vertical alignment. In addition, some docking stations have motors for automatic docking or rely on complicated mechanical linkages to achieve same. These docking stations tend to be disadvantageous because they are physically large (often too tall for use under a monitor), they are prone to mechanical failure, and/or they tend to be undesirably expensive.

Another general disadvantage of prior art docking stations is that they do not provide an uninterrupted power supply. Though docking stations with docked mobile computing devices are often connected in a computer network where the network server is provided with an uninterrupted power supply so that data transmission and file status are not corrupted, the docking stations and accompanying mobile computing devices are not. Thus, significant likelihood of occasional power failure and data loss is present.

SUMMARY OF THE INVENTION

Accordingly, it is an object of the present invention to provide a docking station well suited for use under a monitor or monitor stand.

It is another object of the present invention to provide a docking station that permits horizontal entry of a mobile computing device into the docking station.

It is another object of the present invention to provide a docking station that has a generally low physical profile, is manually operated and is inexpensive.

It is also an object of the present invention to provide a docking station with intelligent power supply capabilities.

These and related objects of the present invention are achieved by use of a horizontal loading docking station with uninterrupted power supply as described herein.

In one embodiment, the present invention includes a docking station body configured to receive a generally horizontally inserted mobile computing device; a receiving port formed on a first side of said body and configured to receive a mobile computing device; a replicated port formed on a second side of said docking station body and electrically coupled to said receiving port; alignment means for positioning a generally horizontally inserted mobile computing device such that a port of said generally horizontally inserted mobile computing device aligns with said receiving port; engagement means for positively engaging a generally horizontally inserted mobile computing device having a port aligned with said receiving port; means for manually mounting an aligned port of a mobile computing device to said receiving port; and an activation member coupled to said engaging means and said mounting means, wherein movement of said activation member through a first range of motion causes said engagement means to positively engage an aligned mobile computing device and movement of said activation member through a second range of motion causes said mounting means to mount a port of that mobile computing device to said receiving port.

In another embodiment, the present invention includes a docking station body configured to receive a mobile computing device; a receiving port coupled to said docking station body and configured to receive a port of a mobile computing device; a replicated port coupled to said docking station body and electrically coupled to said receiving port; engagement means for positively engaging a mobile computing device having a port to be mounted to said receiving port; means for mounting a port of an engaged mobile computing device on to said receiving port; a manual activation member having a range of motion of activation that is coupled to said engaging means and said mounting means to provide manual activation of said engaging means and said mounting means; and security means provided within said range of motion of activation of said activation member. The security means is preferably a locking mechanism attachment means.

In yet another embodiment, the present invention includes a docking station body; a power supply port formed in said docking station body; a receiving port coupled to said docking station body and configured to receive a mobile computing device; a replicated port coupled to said docking station body and electrically coupled to said receiving port; an alternative power supply mechanism that has the potential to supply power; a switch coupled between the outputs of said power supply port and said alternative power supply mechanism; and means for switching said switch from the power supply port output to the alternative supply mechanism output when power is not present at said power supply port. In a preferred embodiment, the alternative power supply mechanism is a battery charging mechanism.

The attainment of the foregoing and related advantages and features of the invention should be more readily apparent to those skilled in the art, after review of the following more detailed description of the invention taken together with the drawings.

BRIEF DESCRIPTION OF THE DRAWINGS

FIG. 2 is a plan view of linkage between an external lever and the engaging and mounting mechanisms in the undocked position in accordance with the present invention.

FIG. 5 is a plan view of linkage between the external lever and the engaging and mounting mechanisms of FIG. 2 in the docked position in accordance with the present invention.

DETAILED DESCRIPTION

Figure 1:
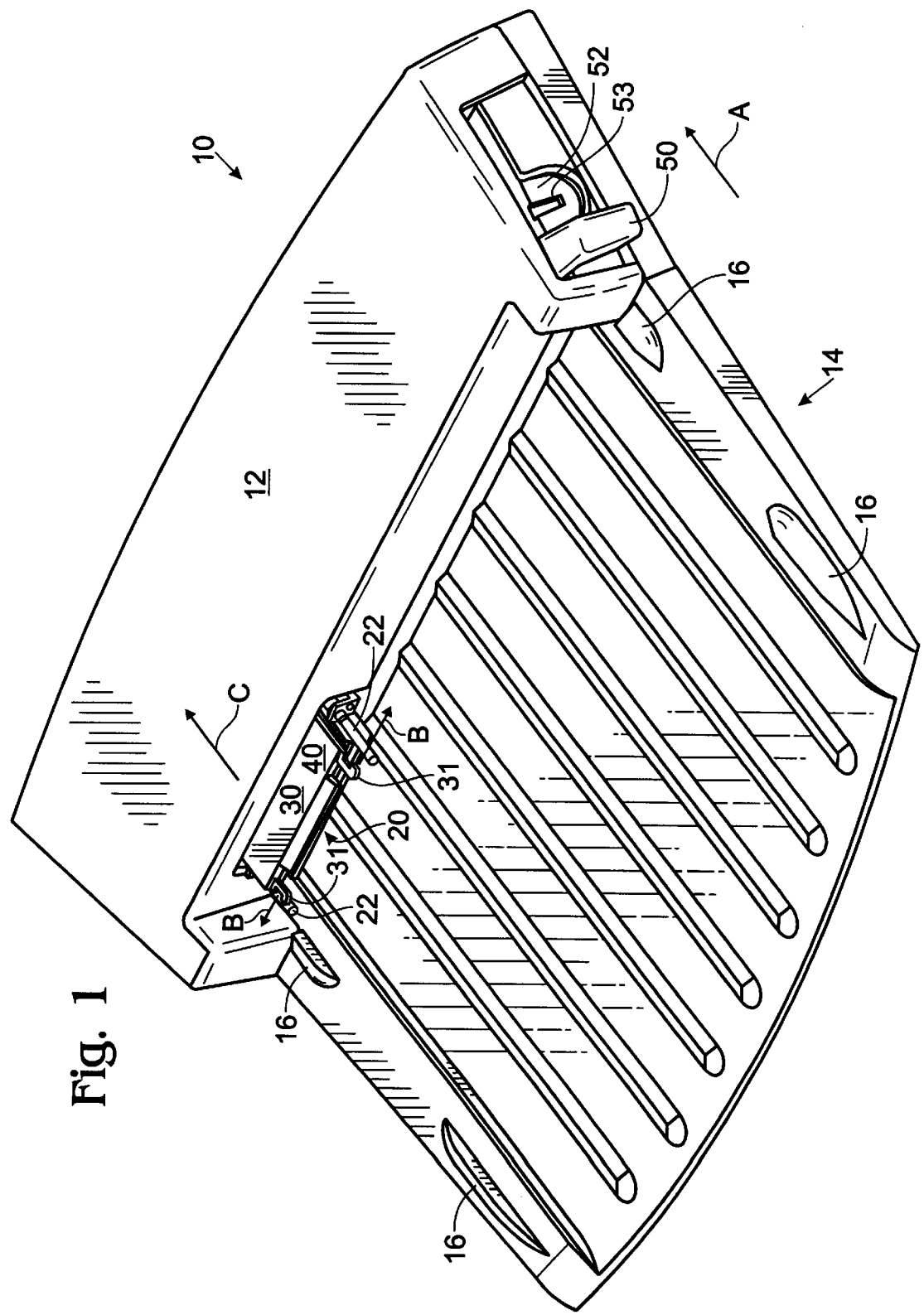
FIG. 1 is a perspective view of a docking station in accordance with the present invention.

Referring to FIG. 1, a perspective view of a docking station 10 in accordance with the present invention is shown. Docking station 10 includes a docking station body 12 that houses both mechanical linkage for mounting a mobile computing device and electronic components for port replication and external communication. A tray or ramp 14 may be coupled to body 12. Ramp 14 preferably includes a plurality of a protrusion 16 or the like for aligning a mobile computing device for proper docking.

Body 12 includes a receiving port 20 and preferably provides alignment pins 22 which engage complementary holes in the back of a mobile computing device and assure proper alignment of that mobile computing device's port with receiving port 20.

Body 12 also includes a mechanism 30 for positively engaging a mobile computing device and a mechanism 40 for mounting the port of an engaged mobile computing device to receiving port 20. (In FIG. 1, the receiving port is partially obscured by part of the engaging mechanism 30.) As discussed in more detail below, there is overlap between components of engaging mechanism 30 and mounting mechanism 40.

A lever 50 extends from the side of body 12. Initial movement of lever 50 in the direction of arrow A causes fingers 31 of the engaging mechanism to move outward in the direction of arrow B. Further movement of lever 50 causes the fingers to be retracted towards body 12 (in the direction of arrow C) until the port of a mobile computing device is mounted (docked) at receiving port 20. The linkage between lever 50 and engaging and mounting mechanisms 30,40 is discussed in more detail below.

Figure 8:
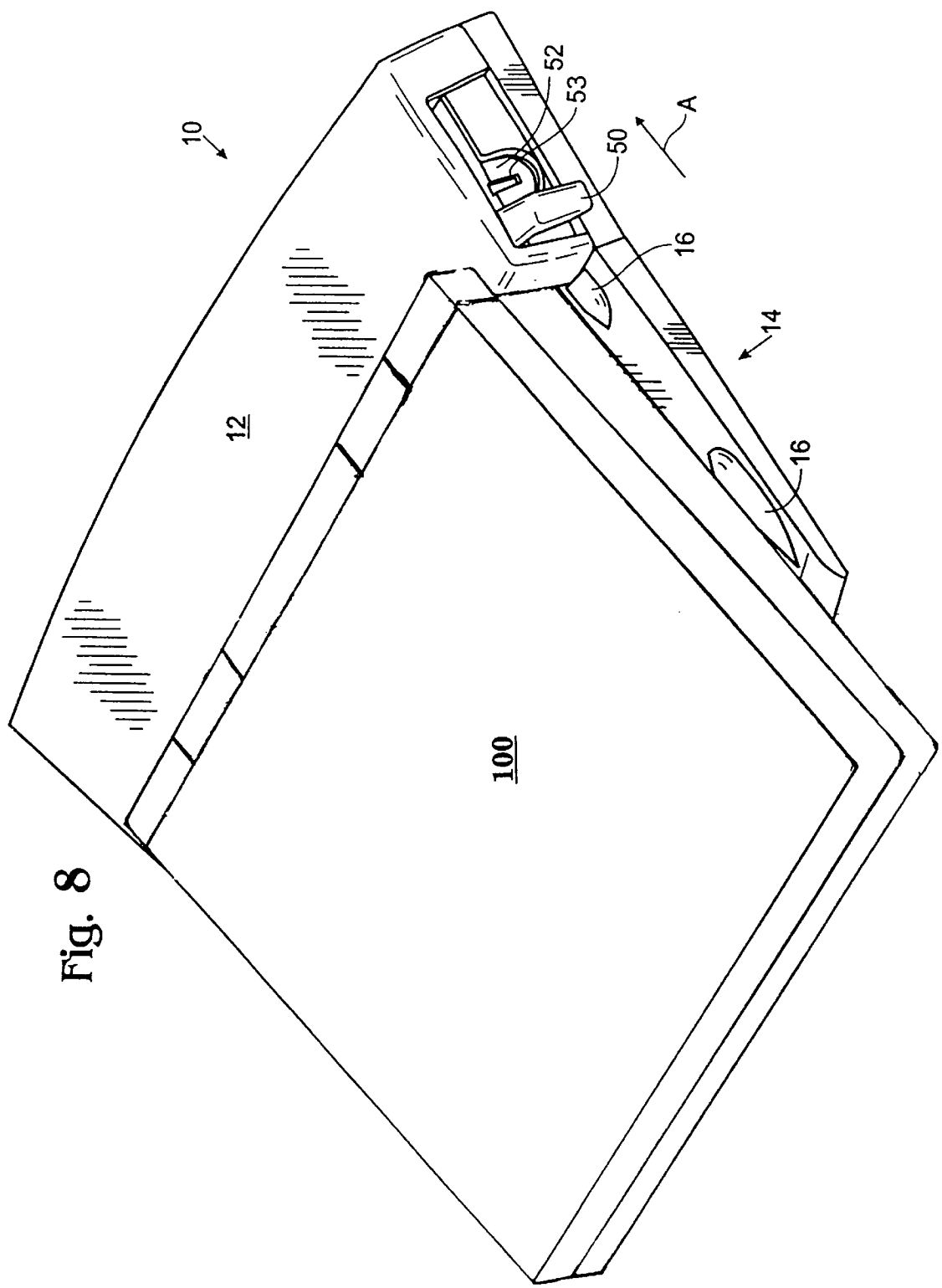
FIG. 8 is a perspective view of the computing system in accordance with the present invention.

A recession 52 and a slot 53 are preferably provided proximate lever 50 and in the range of motion thereof, generally as shown. The recession and slot permit fastening of a Kensington™ or like locking device to body 12. A locking device may be placed in slot 53 on the right side of lever 50 (from the perspective of FIG. 1) when a mobile computing device is not docked, and in slot 53 on the left side of lever 50 when a mobile computing device is docked. The provision of a locking device on the left side of lever 50, prevents movement of lever 50 in the direction opposite of arrow A, which prevents undocking a mobile computing device. In this manner, the docking station and a docking station with docked mobile computing device can be secured with the same locking arrangement. Docking station 10 is shown docked to mobile computing device 100 in FIG. 8.

Referring to FIG. 2, a plan view of linkage between lever 50 and engaging and mounting mechanism 30,40 (in the undocked position shown in FIG. 1) is shown in accordance with the present invention. Engaging fingers 31 are preferably provided in a follower 32 and carriage 42 arrangement (described in more detail below). Each of follower 32 and carriage 42 contains a pin 33,43, respectively. These pins are positioned through slots 61,62 in cam 60. Cam 60 is coupled by pin 59 to a handle 57 which pivots about pivot pin 58 and is formed integrally with lever 50. Pins 65 and slots 63 restrict movement of cam 60 to the X direction. It should also be recognized that the portion of slot 62 along the X-axis (that portion on the right side of line D—D) prevents a mobile computing device from being pushed onto the receiving port (i.e., a mobile computing device can only be mounted by movement of lever 50).

As lever 50 is initially pushed in the direction of arrow A, it causes movement of follower 32 relative to carriage 42 because of the different configurations of slots 61,62 on the right hand side of line D—D. This relative movement causes fingers 31 to move outward (as discussed with respect to FIGS. 3–4 below). On the left side of line D—D, the slots have the same configuration (slope) causing follower 32 and carriage 42 to move together and retract into body 12 while maintaining fingers 31 in the engaged position. Spring 55 biases handle 57 toward the undocked position. Friction of the linkage mechanism and the weight of a mobile computing device counteract the spring bias. The end of spring 55 is attached to the housing of docking station 10 (FIG. 1).

Figure 3:
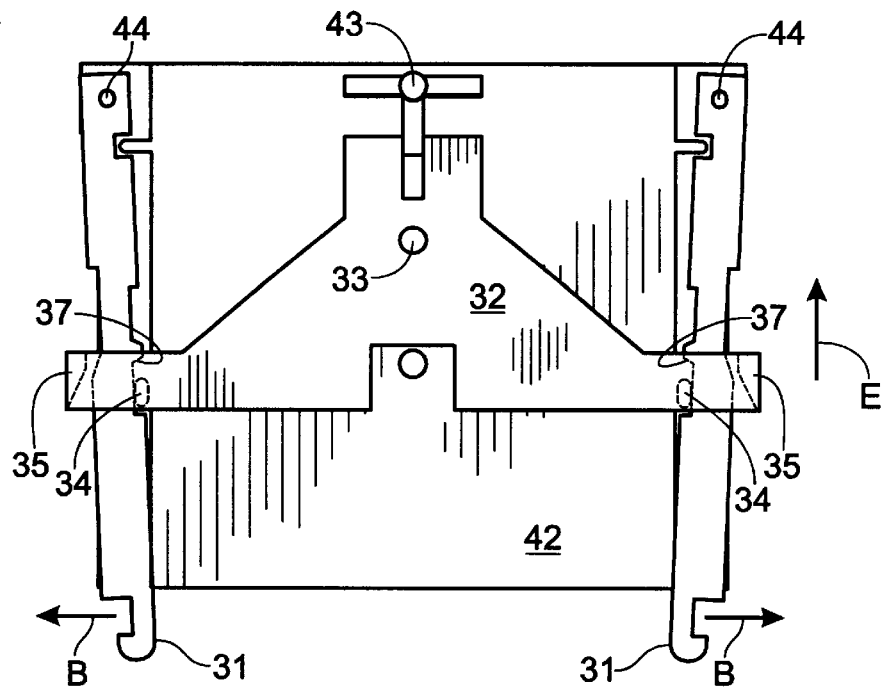
FIG. 3 is a diagram of engagement fingers, a follower and a carriage in the unengaged position in accordance with the present invention.

Referring to FIG. 3, a diagram of fingers 31, follower 32 and carriage 42 in the unengaged position in accordance with the present invention is shown. Carriage 42 includes guide pin 43 and pivot pins 44 to which fingers 31 attach. Follower 32 includes guide pin 33 and finger guiding protrusions 34,35. As lever 50 is initially moved in the direction of arrow A (FIG. 1), follower 32 is moved in the direction of arrow E. This motion causes protrusions 34 to contact faces 37 of fingers 31 and push these fingers outward (in the direction of arrow B). The movement of follower 32 such that protrusions 34 push out faces 37 is caused by the relative movement of follower 32 and carriage 42 discussed above with respect to FIG. 2.

Figure 4:
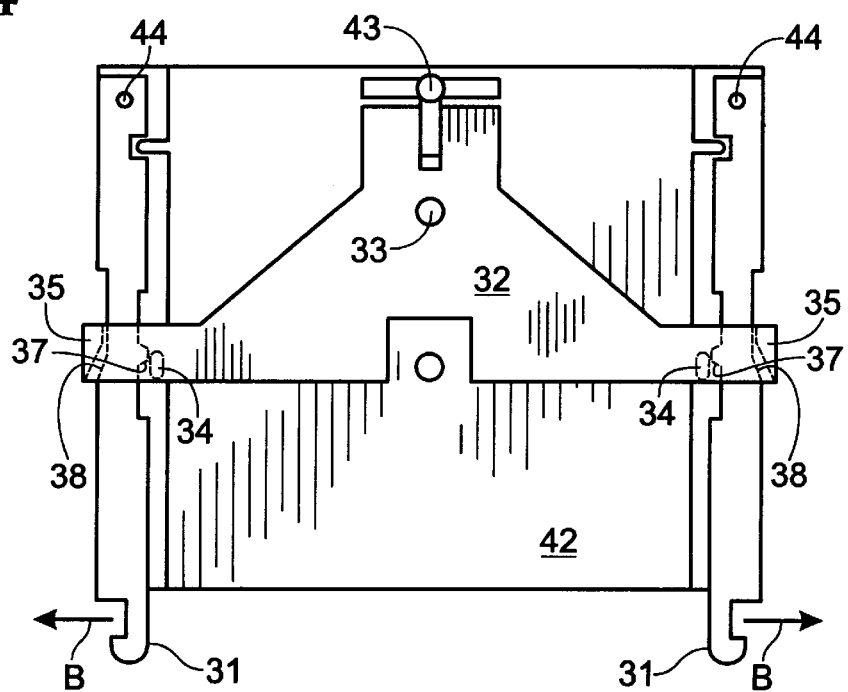
FIG. 4 is a diagram of the engagement fingers, follower and carriage of FIG. 3 in the engaged position in accordance with the present invention.

Referring to FIG. 4, a diagram of fingers 31, follower 32 and carriage 42 in the engaged position is shown in accordance with the present invention. Protrusions 34 have been pushed past faces 37 to push fingers 31 into the extended or engaged position. The unengaged position is again attained by movement of lever 50 opposite the direction of arrow A (such that pins 33,43 move through the range of motion that occurs on the right side of line D—D). This causes protrusions 35 to contact faces 38 and push the fingers back into the unengaged position, opposite the direction of arrow B.

Referring to FIG. 5, a plan view of linkage between lever 50 and the engaging and mounting mechanisms 30,40 in the docked position is shown in accordance with the present invention. Cam 60 has been moved to the right (from the perspective of FIG. 2) forcing follower and carriage pins 33,43 (and the carriage and follower) in the direction of arrow C of FIG. 1. This motion mounts the port of a mobile computing device securely on the receiving port. It should be recognized that an alternative has been contemplated in which slots 61,62 are extended to the left as indicated by the dashed lines to prohibit removal of a mobile computing device from the docking station without movement of lever 50 in the direction opposite of arrow A.

Figure 6:
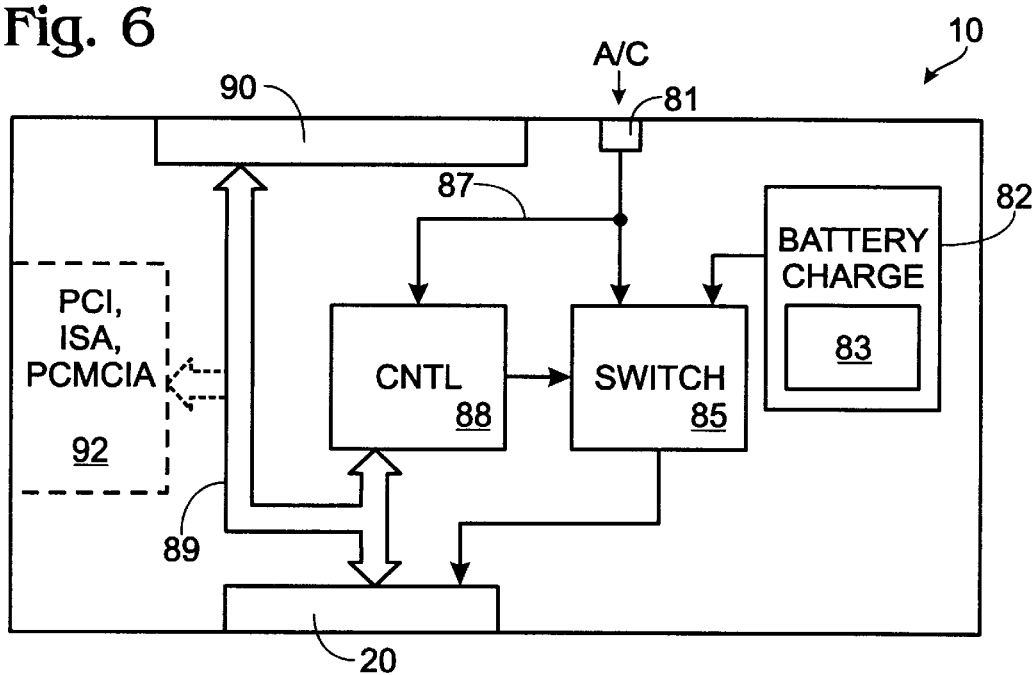
FIG. 6 is a schematic diagram of electrical components housed within the docking station body in accordance with the present invention.

Referring to FIG. 6, a schematic diagram of electrical components housed within docking station body 12 is shown in accordance with the present invention. An exterior AC power port 81 and battery charging unit 82 (with battery 83) are connected to a switch 85. Switch 85 is preferably a non-mechanical, electrically controlled power switch such as an SCR which allows fast, reliable switching of power sources. A power sense line 87 is connected between the AC port and a controller 88. Controller 88 may be any of a type of microcontroller that are available commercially. When controller 88 detects that AC power has failed, switch 85 is toggled to the battery charge unit output power line which receives power from battery 83. Controller 88 also preferably sends a signal through receive port 20 to indicate to a docked mobile computing device that AC power has failed. The mobile computing device can respond accordingly, perhaps initiating a controlled shut down.

FIG. 6 also illustrates a data communication bus 89 coupled between controller 88, receiving port 20 and replicated port 90. It should be recognized that the docking station may also contain PCI, ISA and PCMCIA slots for Ethernet adapters, video cards, audio cards, modems, etc., generally represented by reference number 92 and shown in dashed lines.

Figure 7:
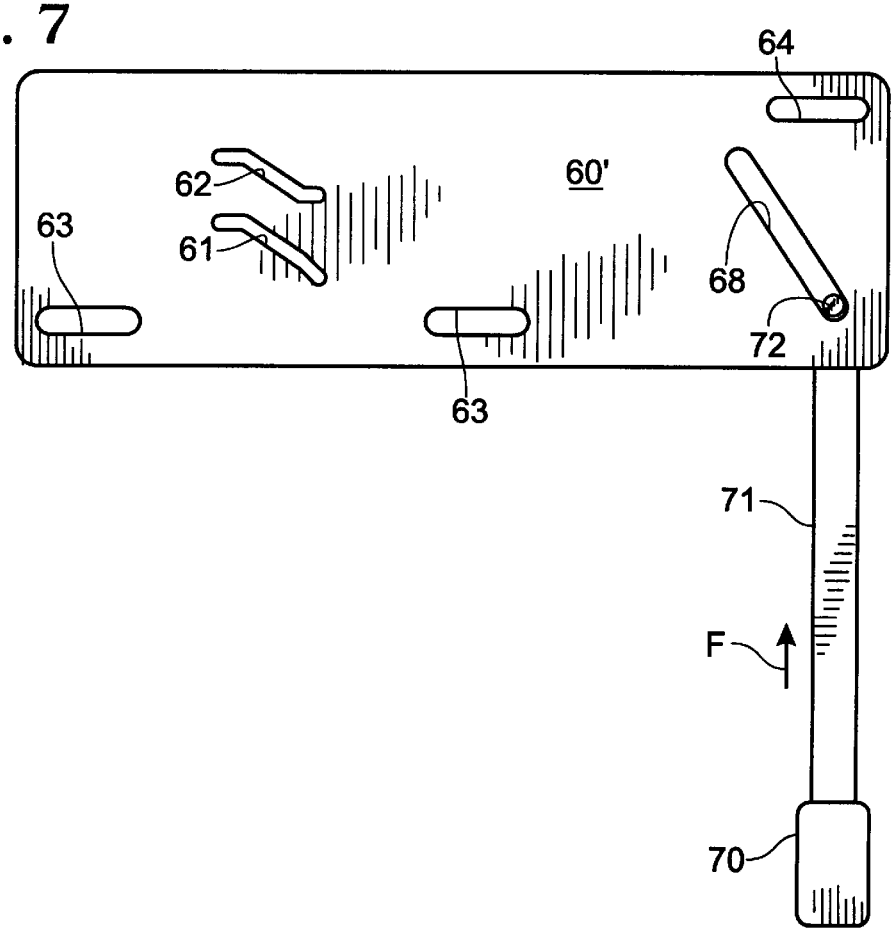
FIG. 7 is a plan view of an alternative linkage arrangement in accordance with the present invention.

Referring to FIG. 7, a diagram of an alternative linkage arrangement in accordance with the present invention is shown. In the embodiment of FIG. 7, cam 60' includes slots 61–63 of cam 60 (of FIG. 2) and an additional positioning slot 64. Instead of being pivotally linked to handle 57, however, cam 60' has a diagonal slot 68 to which pin 72 is inserted. Pin 72 is connected to one end of shaft 71, while a handle 70 is located at the opposite end of shaft 71. Slot 64 provides additional stability to cam 60'. Movement of handle 70 in the direction of arrow F causes the cam to move to the right, which would cause engaging fingers 31 to engage and retract as described above. The embodiment of FIG. 7 permits the manual activation handle to be placed at the front of the docking station (for example, at the base of ramp 14), thereby permitting an operator to dock and undock a mobile computing device from the front of the docking station. Such an arrangement is well suited for use under a monitor stand that has side walls and similar environments where access to a side lever (50) might be impeded. Side lever 50 works well with "legged" and movable arm monitor stands and like environments.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

What is claimed is:

1. A docking station, comprising:
   a docking station body configured to receive a mobile computing device that is generally horizontally inserted into said docking station body;
   a receiving port formed on a first side of said body and configured to receive the mobile computing device;
   a replicated port formed on a second side of said docking station body and electrically coupled to said receiving port;
   alignment means for positioning the mobile computing device such that a port of the mobile computing device aligns with said receiving port;
   engagement means for positively engaging the mobile computing device having a port aligned with said receiving port;
   means for manually mounting an aligned port of the mobile computing device to said receiving port; and
   an activation member coupled to said engaging means and said mounting means, wherein movement of said activation member through a first range of motion causes said engagement means to positively engage the aligned mobile computing device and further movement of said activation member through a second range of motion causes said mounting means to mount a port of that mobile computing device to said receiving port thereby creating a docked mobile computing device, and wherein said engagement means includes means for preventing mounting of the port of the mobile computing device to said receiving port without movement of said activation member by an operator.

2. The docking station of claim 1, further comprising means for preventing undocking of a port of the docked mobile computing device from said receiving port without movement of said activation member by an operator.

3. The docking station of claim 1, wherein said engaging means further comprises:
   cam means coupled to said activation members;
   an engagement finger; and
   an engagement finger control mechanism coupled to said cam.

4. The docking station of claim 3, wherein said engagement finger control mechanism includes a first member coupled to said cam and said engagement finger for causing said finger to move when said activation member is moved through said first range of motion.

5. The docking station of claim 4, further comprising:
   a second member coupled between said cam and said engagement finger;
   wherein said first and second members and said cam are configured such that said first and second members move relative to one another during said first range of motion, said relative movement causing said finger to move between an engaged and a non-engaged position.

6. The docking station of claim 5, wherein said first and second members and said cam are further configured such that said first and second members do not substantially move relative to one another during said second range of motion.

7. The docking station of claim 1, further comprising an uninterrupted power supply mechanism.

8. The docking station of claim 7, further comprising means for generating a signal to said receiving port to indicate to the mobile computing device docked at said receiving port that the source of power thereto has changed.

9. The docking station of claim 1, further comprising:
   an alternative power supply mechanism that has the potential to supply power;
   a power supply port formed in said docking station body;
   means for sensing the presence of power from said power supply port;
   a switch for switching between an output of each of said alternative power supply mechanism and said power supply port; and
   switch control means coupled to said sensing means and said switch for switching said switch from said power supply port to said alternative power supply mechanism when power from the power supply port is not present.

10. The docking station of claim 9, wherein said alternative power supply mechanism includes a battery charging mechanism.

11. The docking station of claim 1, further comprising:
   a recession and a slot proximate to said activation member; and
   a locking mechanism attachment means provided in said recession and said slot;
   wherein said first range of motion and said second range of motion are contiguous and said locking mechanism attachment means prevents movement of the activation member, and
   wherein both the docking station alone and the docking station with the docked mobile computing device together are capable of being secured with said locking mechanism attachment.

12. A docking station, comprising:
   a docking station body configured to receive a mobile computing device, said docking station body having a recession and a slot;

a receiving port coupled to said docking station body and configured to receive a port of the mobile computing device;

a replicated port coupled to said docking station body and electrically coupled to said receiving port;

means for mounting a port of the mobile computing device on to said receiving port thereby creating a docked mobile computing device;

a manual activation member having a range of motion of activation proximate to said recession and said slot, said manual activation member coupled to said mounting means to provide manual activation of said mounting means; and security means provided in said recession and said slot within said range of motion of activation of said activation member.

13. The docking station of claim 12, wherein said security means includes a locking mechanism attachment means, and wherein both the docking station alone and the docking station with the docked mobile computing device together are capable of being secured with said locking mechanism attachment.

14. The docking station of claim 12, wherein said security means facilitates impeding movement of the activation member.

15. The docking station of claim 12, wherein said security means facilitates impeding movement of the activation member in both a direction that would mount the mobile computing device to the docking station and in a direction that would unmount the mobile computing device from the docking station.

16. A docking station, comprising:

a docking station body;

a power supply formed in said docking station body;

a receiving port coupled to said docking station body and configured to receive a port of a mobile computing device;

a replicated port coupled to said docking station body and electrically coupled to said receiving port;

means for mounting the port of the mobile computing device on to said receiving port thereby creating a docked mobile computing device;

a manual activation member having a range of motion of activation that is coupled to said mounting means to provide manual activation of said mounting means, wherein said means for mounting includes engagement means for engaging the mobile computing device wherein the engagement means prevents mounting of the port of the mobile computing device to said receiving port without movement of said manual activation member by an operator;

an alternative power supply mechanism that has the potential to supply power;

a switch coupled between the outputs of said power supply port and said alternative power supply mechanism; and means for switching said switch from the power supply port to the alternative supply mechanism output when power is not present at said power supply port.

17. The docking station of claim 16, wherein said alternative power supply mechanism is a battery charging mechanism.

18. A computing system, comprising:

a mobile computing device having a port;

a docking station, comprising:

a docking station body configured to receive the mobile computing device that is generally horizontally inserted into said docking station body;

a receiving port formed on a first side of said body and configured to receive the mobile computing device;

a replicated port formed on a second side of said docking station body and electrically coupled to said receiving port;

alignment means for positioning the mobile computing device such that a port of the mobile computing device aligns with said receiving port;

engagement means for positively engaging the mobile computing device having a port aligned with said receiving port;

means for manually mounting an aligned port of the mobile computing device to said receiving port; and an activation member coupled to said engaging means and said mounting means, wherein movement of said activation member through a first range of motion causes said engagement means to positively engage the aligned mobile computing device and movement of said activation member through a second range of motion causes said mounting means to mount a port of that mobile computing device to said receiving port thereby creating a docked mobile computing device, and wherein said engagement means includes means for preventing mounting of the port of the mobile computing device to said receiving port without movement of said activation member by an operator.

* * * * *